United States Patent [19]

Weber

[11] Patent Number: 5,055,416

[45] Date of Patent: Oct. 8, 1991

[54] ELECTROLYTIC ETCH FOR PREVENTING ELECTRICAL SHORTS IN SOLAR CELLS ON POLYMER SURFACES

[75] Inventor: Michael F. Weber, St. Paul, Minn.

[73] Assignee: Minnesota Mining and Manufacturing Company, Saint Paul, Minn.

[21] Appl. No.: 281,099

[22] Filed: Dec. 7, 1988

[51] Int. Cl.$^5$ ............................................. H01L 31/18
[52] U.S. Cl. ........................................ 437/4; 437/170; 437/245; 437/923; 437/181; 204/129.1; 204/129.2; 204/129.3; 204/129.55
[58] Field of Search ............... 204/129.1, 129.2, 129.3, 204/129.55; 437/170, 245, 181, 923

[56] References Cited

U.S. PATENT DOCUMENTS

| | | | |
|---|---|---|---|
| 4,166,918 | 9/1979 | Nostrand | 136/89 R |
| 4,385,971 | 5/1983 | Swartz | 204/129.1 |
| 4,451,970 | 6/1984 | Izu | 29/574 |
| 4,471,036 | 9/1984 | Skotheim | 428/111 |
| 4,488,349 | 12/1984 | Murakami | 29/575 |
| 4,510,674 | 4/1985 | Izu | 29/574 |
| 4,510,675 | 4/1985 | Izu | 29/574 |
| 4,543,171 | 9/1985 | Firester et al. | 204/129.3 |
| 4,544,797 | 10/1985 | Hewig | 136/249 |
| 4,640,002 | 2/1987 | Phillips | 29/574 |
| 4,729,970 | 3/1988 | Nath et al. | 437/170 |
| 4,749,454 | 6/1988 | Arya et al. | 437/923 |
| 4,774,193 | 9/1988 | Juergens | 437/923 |
| 4,806,496 | 2/1989 | Suzuki et al. | 437/170 |
| 4,812,415 | 3/1989 | Yamazaki et al. | 437/170 |

OTHER PUBLICATIONS

Matsumura, M. et al., J. Appl. Phys. 61, 1648-1649 (1987).

Primary Examiner—Brian E. Hearn
Assistant Examiner—Trung Dang
Attorney, Agent, or Firm—Kinney & Lange

[57] ABSTRACT

A method for preventing shorts and shunts in solar cells having in order, an insulating substrate, a conductive metal layer on the substrate, an amorphous silicon layer and a transparent conductive layer. The method includes anodic etching of exposed portions of the metal layer after deposition of the amorphous silicon and prior to depositing the transparent conductive layer.

20 Claims, 2 Drawing Sheets

ELECTROLYTIC ETCH FOR PREVENTING ELECTRICAL SHORTS IN SOLAR CELLS ON POLYMER SURFACES

The Government of the United States of America has rights in this invention pursuant to subcontract ZB-4-03056-2 awarded by the United States Department of Energy.

BACKGROUND OF THE INVENTION

The invention relates generally to photovoltaic devices and, in particular, to a method for producing photovoltaic devices which are substantially free of shorts and shunts.

Electrical shorts between the top and bottom conductive contacts of amorphous silicon p-i-n type solar cells frequently are formed during fabrication of the cells. Several methods have been suggested to prevent shorts in solar cells. Matsumara et al.; J. Appl. Phys. 61 1648 (1987) discloses a method to prevent short circuits. The disclosed method involves intermediates: i.e. glass substrates with a transparent conductive oxide (TCO) layer covered by an amorphous silicon layer. The amorphous silicon layer is intentionally fissured to confirm the usefulness of the method. The intermediate including the exposed transparent conductive oxide layer is placed in contact with an electrolyte solution of 0.5 mol/l of $H_2SO_4$ including a platinum counter electrode and cathodically polarized at 0.7 volts relative to a saturated calomel electrode. As a result of such treatment, the transparent conductive oxide layer dissolves at pin holes. Subsequently, the amorphous silicon is coated with aluminum to produce a solar cell free from shorts.

The Izu, U.S. Pat. No. 4,451,970, discloses systems and methods for detecting and eliminating short circuit current paths through photovoltaic devices including at least one semiconductor region overlying a metallic substrate and a conductive light transmissive material overlying at least one semiconductor region. The elimination is provided by removing transparent conductive material from the pathway. As a result, the metal electrode and the TCO are electrically isolated.

The Murakami et al. U.S. Pat. No. 4,488,349, discloses a method of repairing shorts in parallel-connected vertical semiconductor devices by anodizing to form an insulating material in pin holes prior to formation of an electrode.

The Nostrand et al. U.S. Pat. No. 4,166,918, discloses a method of removing shorts by applying a reverse bias voltage to "burn out" the shorts. The applied voltage is less than the breakdown voltage of a solar cell.

The Hewig U.S. Pat. No. 4,544,797, discloses a method for preventing shorts and shunts by chemically etching at pinholes. The method passivates the unit prior to applying a second semiconductor layer. The passivation converts an exposed metal layer portion, associated with a pinhole, into an insulator.

The prior art also includes several teachings against applying a forward bias to semiconductor devices. Izu et al., in U.S. Pat. Nos. 4,510,674 and 4,510,675, teach the desirability of reverse bias over forward bias for detecting shorts in a solar cell. In foward bias, forward conduction is taught to decrease the ability to distinguish a shorted area from an acceptable area of a cell.

The Swartz, U.S. Pat. No. 4,385,971, also teaches that the rectifying junction of solar cells should be in reverse bias during any electrolytic etch in order to cause the electrical current to flow only through the short. Therefore, in order to etch a stainless steel/p-i-n/ITO structure according to Swartz, the stainless steel should be connected to a negative terminal of a DC source. 20% ammonium hydroxide is employed as an electrolyte. Swartz also teaches etching a stainless steel/N-I/platinum Schottky barrier type cell by connecting the stainless steel layer to the positive terminal of a DC source and immersing it in an electrolyte solution of dilute sulfuric or copper sulfate.

SUMMARY OF THE INVENTION

A method for preparing an amorphous silicon solar cell includes anodic removal of any exposed portion of the conductor forming the bottom contact during an electrolytic etch prior to deposition of the transparent conductive layer. The resulting device is substantially free of shorts and shunts.

DETAILED DESCRIPTION OF THE PREFERRED EMBODIMENTS

Figure 1:
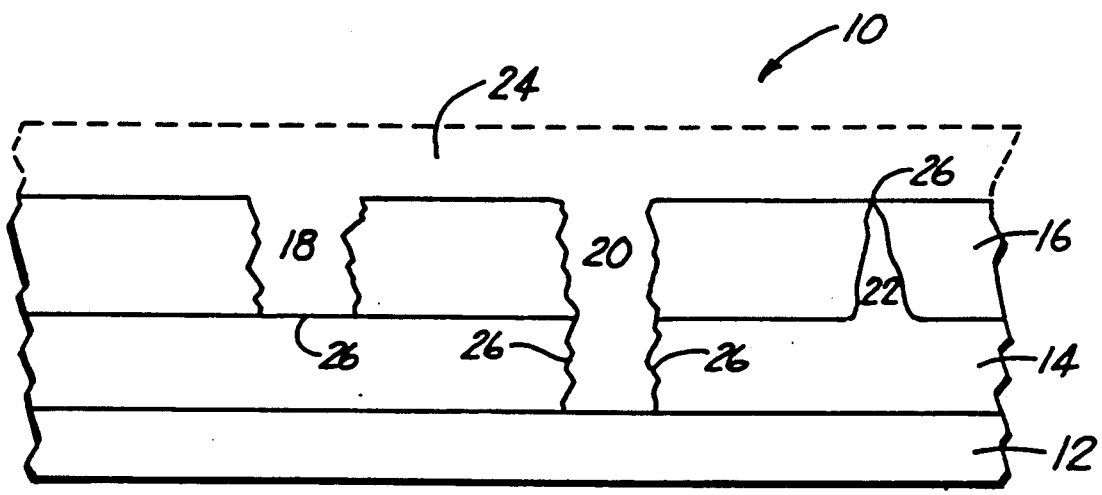
FIG. 1 is a schematic view of a cross section of a portion of a partially completed photovoltaic device showing defects likely to become shorts or shunts in a completed device.

An intermediate of a portion of an amorphous silicon device is generally schematically shown in FIG. 1 at 10. The device 10 includes a substrate layer 12. Typically, the substrate layer 12 is formed of materials such as glass or polymer. The substrate layer has an overlying metal layer 14, such as aluminum, silver, or stainless steel, which serves as a bottom electrode. Overlying the metal layer 14, is an amorphous silicon portion or layer 16. The amorphous silicon portion 16 typically includes three layers: a p+ doped amorphous silicon layer; an intrinsic amorphous silicon layer; and an n+ doped amorphous silicon layer. When the p+ doped is in contact with the metal layer 14, the device 10 may be described as a "p-i-n" cell. When the n+ layer is in contact with the metal layer 14, the device may be described as an "n-i-p" cell.

Three well-known types of defects are represented in FIG. 1. First, a material structure discontinuity, or pinhole, 18 extends through the amorphous silicon p-i-n layers 16. Second, a material structure discontinuity or fracture 20 of the metal layer 14 which in turn is accompanied by a material structure discontinuity extending through the amorphous silicon layer 16. Third, a protrusion 22 of the metal layer 14, projecting through a material discontinuity of the amorphous silicon layer 16. (In both FIGS. 1 and 2, material of the layer, behind the defects, is not shown to simplify the Figures.) Each type of defect 18, 20, or 22 includes an exposed metal surface 26 and is a potential source of a short or shunt. Such shorts or shunts will likely be created during a subsequent deposition of a transparent or light transmitting electrically conductive top electrode 24, shown in dotted outline, as an electrical contact formed between the top conductive layer 24 and the exposed metal surfaces 26.

The subject invention anodically etches the metal layer 14 selectively at the exposed metal interfaces 26, such that subsequent application of a top transparent conductor layer 24 does not result in shorts or shunts between the metal layer 14 and the top transparent conductive layer 24. In contrast to prior teachings such as those of U.S. Pat. No. 4,385,971, the anodic etch of the present invention causes a harmless forward bias during the etching step. The subsequently formed solar cell is not damaged by the forward bias occuring during the etch.

An n-i-p amorphous silicon device, is put in reverse bias by an anodic etch process. Such n-i-p devices may also be treated by the anodic etch process of this invention, to reduce or eliminate shorts or shunts.

Figure 2:
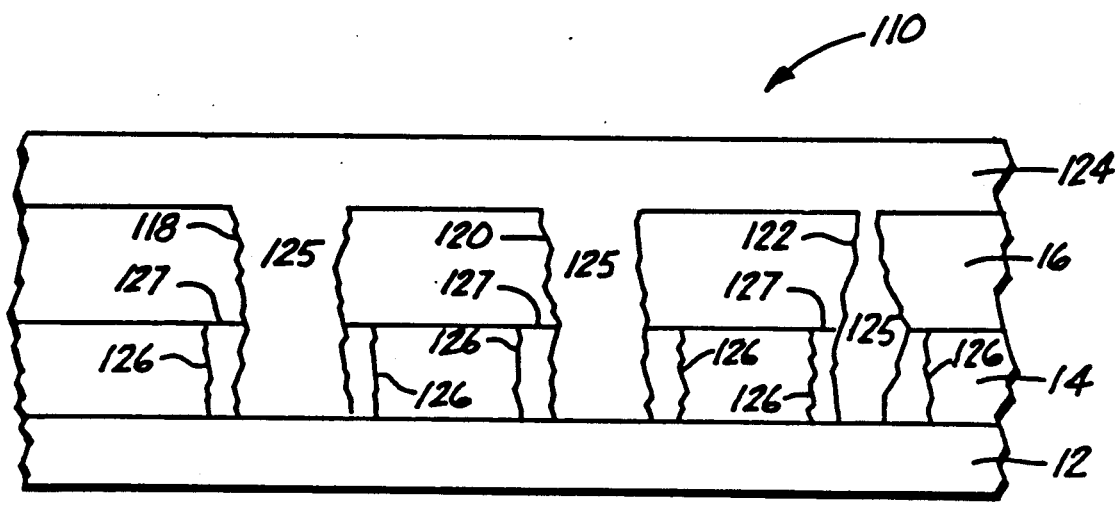
FIG. 2 is a schematic cross sectional view of a portion of a device produced by the method of this invention.

An amorphous silicon device of this invention is generally shown at 110 in FIG. 2. The device 110 includes the substrate layer 12, the overlaying layer 14 and the amorphous silicon layer 16. The discontinuities and defects 18, 20, and 22 of the intermediate 10 of FIG. 1, are schematically represented in the device 110 of FIG. 2 by discontinuities 118, 120 and 122, respectively. Etched metal surfaces 126 in FIG. 2 are based on the previously exposed metal surfaces 26 of the intermediate 10 of FIG. 1. The etched metal surfaces 126 in FIG. 2 are the result of the exposed metal surfaces 26 of FIG. 1 having been electrolytically etched by the process of the present invention to an undercutting relationship with respect to amorphous silicon layer 16 starting from the defects or discontinuities 18, 20 and 22 of layer 16 in FIG. 1. The undercutting relationship of the metal edges 126 with respect to the discontinuities 118, 120 and 122 may be described as aligned, in that the set back 127 generally follows the outline of the discontinuities 118, 120 and 122 of the amorphous silicon layer 16. The top conductive layer 124, shown in dotted outline, is believed to include integral projections 125 which extend into or through the discontinuities 118, 120 or 122 of the amorphous silicon layer 16. The integral projections 125 fail to contact the etched metal edges 126 of the metal layer 14 due to the setback 127. Effectively, the set back 127 defines a part of a space or void which separates projections 125 and etched metal edges 126.

Effectively, the etched metal edges 126 define material structure discontinuities in the metal layer 14 which are aligned with and set back from the projections 125 of the top conductive layer 124.

Figure 3:
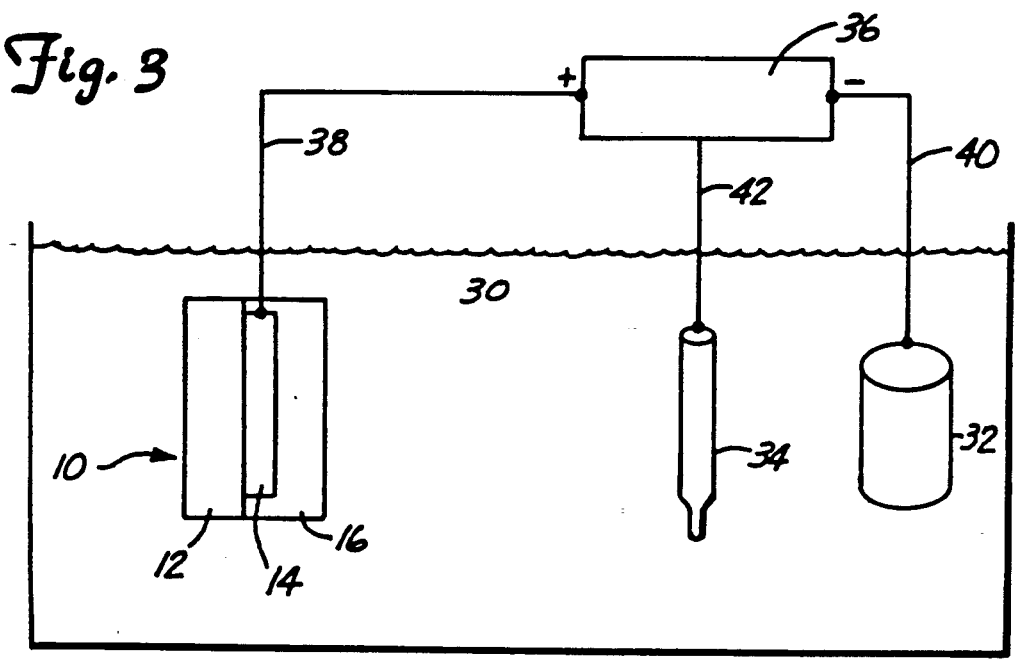
FIG. 3 is a schematic view of an arrangement for fabricating in a batch process of this invention.

The method of selectively removing the exposed edges 26 of the metal layer 14, adjacent the pinholes 20 and fractures 22, may be understood with general reference to FIG. 3.

In FIG. 3, the intermediate of the amorphous silicon device 10 of FIG. 1 is shown immersed in an electrolyte solution 30. Also immersed in the electrolyte solution 30 is an auxiliary or counter electrode 32, preferably formed of platinum, and a reference electrode 34, for example, a dynamic hydrogen electrode. The metal layer 14 of the amorphous silicon device 10, the platinum auxiliary or counter electrode 32 and the reference electrode 34 are all independently connected to a voltage supply, for example potentiostat 36 by insulated conductors or wires 38, 40 and 42, respectively. The potentiostat 36 is used to apply an anodic voltage to the metal layer 14 and a cathodic voltage to the platinum auxiliary electrode 32.

In general, the electrolyte solution 30 must be compatible with hydrogenated amorphous silicon devices and must be capable of serving as a solvent for the anodized metal. By "compatible" is meant that the electrolyte solution 30 does not degrade or destroy the amorphous silicon device. For example, electrolyte solutions which tend to chemically react with or dissolve, swell or strongly bind to any component parts of the amorphous silicon device are considered incompatible. The electrolyte solution 30 preferably includes ammonium hydroxide at a concentration of approximately 10%. However, concentrations from about 5% to about 20% will function adequately as an electrolyte. Volatile solvents, such as ammonium hydroxide, are those which can serve as an electrolyte etchant and subsequently be volatilized away.

If a non-volatile electrolyte is employed, the electrolyte must be later removed by cleaning. Hydrochloric acid and hydrofluoric acid are volatile electrolytes which are incompatible for use in some applications of the subject invention. Specifically, hydrochloric acid and hydrofluoric acid tend to preferentially etch the interface region between a metal electrode and a substrate such as polyimide. This preferrential etching sometimes proceeds rapidly in certain directions in a linear fashion, a phenomenom referred to as "crazing." "Crazing" is generally destructive of an amorphous silicon device.

Generally, any metal capable of anodic etching may be removed by the method of this invention. Metal layers which have been successfully etched by this method include silver and aluminum. Additionally, alternative metal layers which may be etched by the method include, but are not limited to: tin, chromium, nickel and stainless steel.

Etching of the metal must be performed before any conducting top layer is deposited. If, contrary to the invention, the top conductive layer is deposited prior to etching of the conductive metal layer, the top conductive layer will form shorts or shunts to the bottom layer through cell defects 18, 20 and 22 and, therefore, become anodically biased during electrolytic etching. The resulting anodic bias will tend to uniformly etch or dissolve, depending on composition of the entire exposed surface of the top conductive layer 24. The Swartz, U.S. Pat. No. 4,385,971 is representative of such an arrangement. Such an occurrence is particularly detrimental if the top conductive layer is a relatively good conductor. If the top conductor is a relatively poor conductor, the etching will be somewhat localized to the region of the pin hole, but not as localized as the area that can be etched by the subject invention. Further, in order to achieve somewhat localized etching requires an undesirably high sheet resistance in the top layer and yet uncovers an undesirably large surface area of amorphous silicon. The somewhat localized etching is also incompatible with thin film metal electrodes since localized etch is favored by high current densities which cannot be delivered to a shunt via a thin film metal electrode.

Amorphous silicon devices or intermediates of the general type substrate/metal/p-i-n in which the n layer is a high conductivity micro-crystalline n+ layer tend to oxidize on the surface of the n+ layer under the anodic etching conditions of this invention. However, the oxidized portion may be subsequently removed by a dilute hydrofluoric acid rinse or dip. Similar oxidation effect occur with substrate/metal/n-i-p devices and any oxidized portion may also be removed by a dilute hydroflouric acid rinse.

The anodic voltages which may be applied is limited to voltages which will not damage the hydrogenated amorphous silicon layers by causing a damaging forward bias current. While not wishing to be bound by theory, it is believed that charge transfer is restricted by a shortage of electrons at the boundary between the electrolyte solution and the n+ layer at anodic voltages below the oxidation potential of either water or amorphous silicon. At the larger anodic voltages, which are sufficient to produce significant amounts of electrons at the boundary, an unimpeded forward current begins to flow through the hydrogenated amorphous silicon thereby damaging the doping of the silicon. The present invention anodically etches any exposed portions of the metal electrode at voltages which do not cause a damaging forward current in the hydrogenated amorphous silicon.

The voltage difference between the Dynamic Hydrogen Electrode (DHE) of the metal layer 14 should preferably be from 1.5 to 2.0 volts. Voltages of less than approximately 1.0 volt may also be employed. However, the lower voltages etch the exposed metal surface 26 very slowly. Voltages of at least approximately 3.0 volts may also be employed within the general voltage limitations of this invention, but are not preferred because such voltages tend to excessively oxidize the silicon to silicon dioxide. As previously mentioned, the silicon dioxide resulting from such oxidation may be subsequently removed by a subsequent dilute hydrofluoric acid rinsing or dipping step.

Specifically, the thin layer of silicon dioxide produced by oxidation of the silicon at the higher voltages, such as 3.0 volts, may be removed by a brief, for example five second, dip in a mixture of about 1% of approximately 50% hydrofluoric acid in water. The hydrofluoric acid dissolves the silicon dioxide but not the silicon.

Typically, the forward bias current initially observed is on the order of about 1 micro ampere per square centimeter ($\mu$ amp/cm$^2$) and is believed to be associated with etching of exposed metal rather than current passing through the amorphous silicon. As the exposed metal edges 26 are selectively etched from the defects 18, 20 and 22 to form the etched edges 126, the current decreases.

Preferably, the anodic etching removes a small amount (i.e. from approximately a 2000 nm to approximately 200 nm) of exposed metal of surfaces 26 from the defects 18, 20 or 22. In order to be effective, the anodic etching method removes sufficient exposed metal 26 from the area of the defects 18, 20 and 22 to create a set back 27 such that when the transparent conductive electrode layer 124 is subsequently applied, an electrical contact or short or shunt is not established between the metal layer 14 and the top layer 124. That is, the etched edges 126 fail to establish electrical contact with any projection 125 of the transparent conductive layer 124 or the transparent conductive layer 124, itself. Additionally, if the metal layer 14 is a laminated multi-layer type bottom electrode, such as stainless steel on the substrate overlayed with aluminum, both the aluminum and the stainless steel may be selectively removed from the area of the defect 18, 20, or 22.

If the metal layer 14 consists of aluminum, then a voltage from about 1.5 to about 2.0 volts is preferred. Once the exposed metal edge 26 has been sufficiently etched to form new edges 126 with an adequate set back 127 from the discontinuities 118, 120 and 122 remaining from defects 18, 20, or 22, the transparent conductive layer 124 may be deposited.

An optional insulating filler may be applied by electrochemical deposition of insulating materials to the discontinuities 118, 120, or 122 after the anodic etching of the exposed metal edges 26 to form new edges 126. Subsequently, the transparent conductive layer 124 may be deposited upon the amorphous silicon layer with etched and filled discontinuities 118, 120, or 122.

Figure 4:
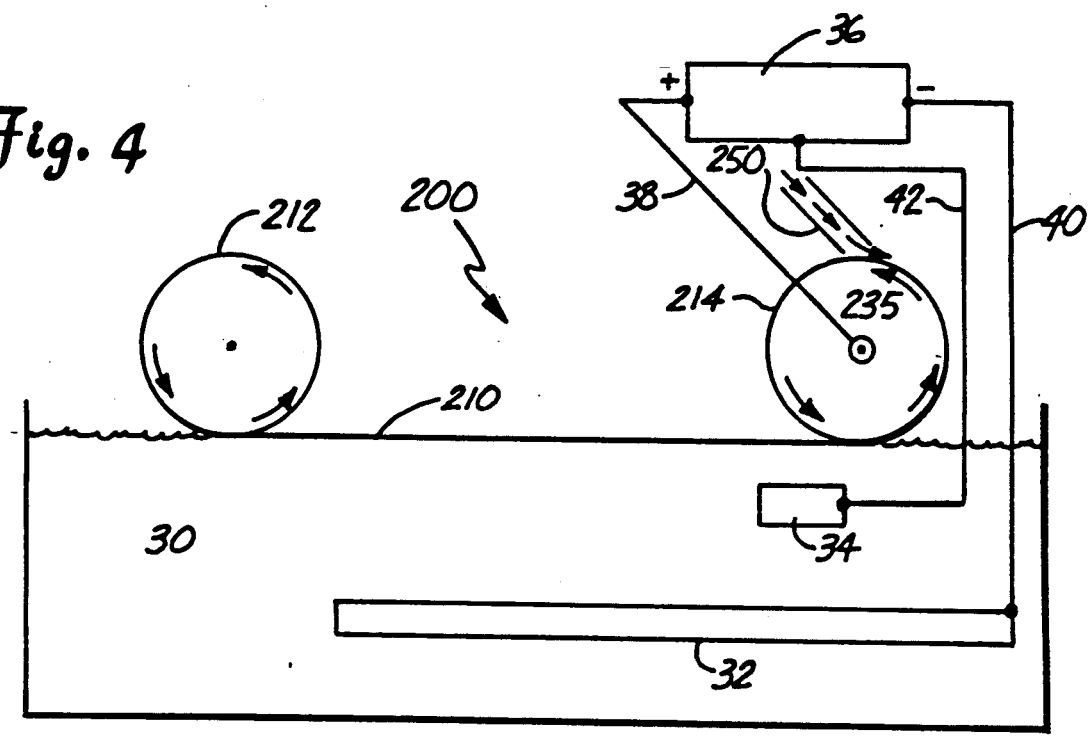
FIG. 4 is a schematic view of an arrangement for fabricating in a continuous process of this invention.

Additionally, the method is suitable as a continuous roll-to-roll process as shown in FIG. 4 generally at 200. A continuous intermediate or web 210 is carried on a feed roll 212 and a take up roll 214. The intermediate 210 is oriented such that the amorphous silicon layer (16 of FIG. 1) faces downward and contacts the electrolyte solution 30, but the substrate 12 does not contact the electrolyte solution 30. Effectively, the web 210 is "floated" over the surface of the electrolyte solution 30 while being wound from the feed roll 212 to the take up roll 214. A counterelectrode 32 is immersed in the electrolyte 30 and connected by an insulated wire to the negative terminal of the potentiostat 36. A D.H.E. 34 is also present to allow voltage regulation. A wire 38 leads from the positive terminal of potentiostat 36 to a rotating contact 235 with the metal layer 14 (of FIG. 1). The intermediate 210 is advanced from roll 212 to roll 214 at a rate such that an effective anodic etching of exposed metal surfaces occurs. A stream of dry nitrogen 250, aids in drying the volatile components of the electrolyte solution 30 from the web 210.

The invention will be further clarified by a consideration of the following examples, which are intended to be purely exemplary of the use of the invention.

EXAMPLE 1

An intermediate of a solar device was prepared which included a polymeric (polyimide) film with an aluminum metal layer and a p-i-n amorphous silicon layer. The intermediate was electrolytically etched at an anodic bias of 1.0 volts for 30 minutes, followed by a brief (approximately 3 minutes) etching at 2 volts. The electrolyte solution was 10% aqueous ammonium hydroxide. Subsequently, a conductive transparent electrode layer was applied and the resulting device tested. In order to evaluate the effectiveness of the etching in preventing shorts or shunts, a portion of the intermediate was not subjected to the etching procedure as a control. Subsequent testing of 36 devices, of size 0.05 cm$^2$, formed from the control portion indicated that all the devices tested included shorts. However, 20 of 20 devices formed from the etched intermediate were free from shorts. Some "crazing" was noted during the 1.0 volt application.

EXAMPLE 2

An intermediate was formed as in Example 1. The intermediate was etched at 1.5 volts anodic potential for 20 minutes. The initial current was approximately 10 micro amps/cm$^2$ of device surface. The final current was 0.5 micro amps/cm$^2$. In this example, only 10 of 36 devices formed from the control portion were relatively free from shorts. However, 24 of 24 devices formed from the etched intermediate were found acceptable.

EXAMPLE 3

An intermediate was formed following the steps described in Example 1. The intermediate was etched at 1.5 volts for one hour. Subsequent to etching, a top transparent conductive layer was applied to form solar devices. The solar devices were subsequently tested. The control group showed 25 of 36 devices tested to be free from shorts. By comparison, however, 24 of the 24 devices tested formed from the etched intermediate were free from shorts.

Additionally, a test of one of the control devices indicated a fill factor of approximately 0.65. By comparison, a test of two of the etched devices indicated fill factors of 0.61 and 0.64, demonstrating that the anodic etching method has a minimal effect on the fill factor of acceptable devices.

EXAMPLE 4

An intermediate was formed following the steps described in Example 1 except that the intermediate of example 4 included a high conductivity micro-crystalline n+ layer. The intermediate was anodically etched at approximately 3.0 volts until the current dropped to approximately 3 micro amps/cm$^2$. The time period for the anodic etching was approximately 10 minutes. Some crazing was noted. 30 of 30 devices tested were free from shorts and most of the devices remained good during subsequent testing under light and drawing a current. However, a barrier layer of silicon dioxide (SiO$_2$) was formed on the micro-crystalline silicon n+ layer.

EXAMPLE 5

An intermediate was formed as in Example 1. The intermediate was etched at 1.52 volts anodic potential. Initially, the etching current was 0.5 milliamps/cm$^2$. After approximately 12 minutes, the current had decreased to approximately 15 microamps/cm$^2$. Solar devices subsequently formed from the control group showed 8 of 36 which were relatively free from shorts. The etched group was tested. Within that group, 29 of 30 devices tested were relatively free from shorts.

EXAMPLE 6

An intermediate was formed as in Example 1, but was kept in a roll. Subsequently a roll-to-roll etching procedure was applied as shown in FIG. 4. The etch was performed at 2.5 V relative to D.H.E. with a web speed consistent with about a ten minute etch exposure. In the etching procedure, the silicon side of the web contacted the ammonium hydroxide electrolyte solution. The back of the web remained dry. Thus, the web effectively was floated across the etching solution. The subsequently produced amorphous silicon devices were substantially free of shorts and shunts.

EXAMPLE 7

An intermediate was prepared and etched as in Example 4. The etched intermediate was subsequently dipped for approximately 5 seconds in a 1% mixture of 50% hydrofluoric acid in water. The purpose of the dip was to remove any silicon dioxide layer resulting from the oxidation of the microcrystalline silicon. Subsequent testing revealed that the series resistance of the sample was approximately 500 ohms for a 0.05 cm$^2$ dot under an illumination level approximately equivalent to 1 sun. The series resistance of the control samples was also approximately 500 ohms.

EXAMPLE 8

A polyimide substrate was laminated with a metal layer of rough aluminum and an overlying coat of silver. The silver layer was then coated with an amorphous silicon coating to form an intermediate. The intermediate was etched at approximately 2.0 volts versus a dynamic hydrogen electrode (D.H.E ). A control group of unetched intermediates subsequently produced only 6 acceptable devices out of 36 devices tested. In comparison, the etched devices showed 36 acceptable devices out of 36 devices tested.

Indium-tin oxide (ITO) is frequently sputtered onto p-i-n cells as a top transparent conductive electrode. A diffusion barrier is desirable to prevent indium from diffusing into the amorphous silicon layer and detrimentally altering the doping.

An alternative embodiment of the method of this invention involves precoating the intermediate with a thin, for example approximately 100 angstroms (A) of high resistivity material suitable as a diffusion barrier before the anodic etching process. Suitable barrier materials include ZnO (optionally doped with Al, In, Ga, or B); SnO$_2$ (doped with F or Sb); CdSnO$_4$; TiO$_2$ (doped with F), and SrTiO$_2$. The alternative process is particularly preferred since a tin oxide or zinc oxide layer is generally necessary as a barrier to diffusion of indium from a subsequently sputter deposited indium-tin oxide (ITO) layer. The advantage of precoating with a thin oxide layer such as tin dioxide or zinc oxide prior to anodic etching is to protect the amorphous silicon from oxidation to silicon dioxide. Thus, the formation of an electrical insulating barrier of silicon dioxide is prevented and a hydrofluoric acid step is not necessary. The tin dioxide is not oxidized or dissolved by anodic voltages of less than about 3.0 volts versus D.H.E. Also, the relative thinness of the layer (approximately 100 angstroms or less) of tin dioxide is not generally sufficient to shield the defects 18, 20, or 22 from anodic etching. Preferably, the thin barrier layer should have a resistivity from about 0.1 to 1.0 ohm cm to prevent lateral current flow from the area of the defect. In use, most shunt sites seem to be eliminated when such a tin dioxide precoat layer is applied prior to etching.

The alternative embodiment will be further clarified by a consideration of the following example, which intended to be purely exemplary of the use of the alternative embodiment.

EXAMPLE 9

An intermediate was prepared as in Example 1. The intermediate was subsequently coated with approximately 80 angstroms of tin dioxide (SnO$_2$) to form a precoat. Next, the coated intermediate was anodically etched at 2.5 volts anodic potential, versus D.H.E. After etching, a 70 nanometer coating of ITO was applied. 0.04 cm$^2$ ink dots were subsequently screen printed and the unprinted ITO coating areas were removed by an acid etch. The ink dot was then removed by rinsing in a solvent (toluene) to expose 0.04 cm$^2$ devices to be tested. 160 out of 170 devices tested were free of shunts. 168 of the devices produced voltages in excess of 0.5 volts under 1 sun illumination. Only 2 of the 170 devices tested demonstrated major shorts which reduced voltages to 0.2 volts or less under 1 sun illumination.

An amorphous silicon device of this invention may be formed by the following steps. First, an intermediate is formed. A suitable intermediate may be formed by sputtering of a metal such as aluminum onto a polyimide film. Amorphous silicon hydride is deposited upon the metal layer by decomposing a mixture of Silane and hydrogen gas and appropriate dopants in a plasma assisted chemical vapor deposition step. An appropriate dopant to form a $p^+$ layer is diborane gas. An appropriate dopant to form an $n^+$ layer is phosphine gas. Preferably, a thin barrier layer of material such as ZnO or $SnO_2$ is sputter coated onto the amphorphous silicon hydride.

Next, the intermediate is electrolytically etched, either in the batch process of FIG. 3 or the continuous process of FIG. 4. If a barrier layer was not used, a brief chemical etch to remove any silicon oxide surface layer may be required. The electrolytically etched intermediate is then dried.

Finally, a transparent top conductive electrode layer is applied by sputtering. The electrolytic etch of the intermediate prevents shorts or shunts from forming between the top electrode and the metal electrode as schematically shown in FIG. 2. Specifically, a discontinuity in the metal layer is aligned with and undercuts a discontinuity in the amorphous silicon layer. Any projections of the top conductive layer through the amorphous silicon layer discontinuity fail to contact the metal layer.

Although the present invention has been described with reference to preferred embodiments, workers skilled in the art will recognize that changes may be made in form and detail without departing from the spirit and scope of the invention.

What is claimed is:

1. A method for preparing an amorphous silicon p-i-n solar cell which incorporates a conductive metal layer interposed between an insulating substrate layer and the p layer of the solar cell and a transparent conductive layer overlying the n layer of the solar cell, the method comprising:
   anodically etching any exposed portions of the metal layer, after deposition of the amorphous silicon and prior to application of the transparent conductive layer, to substantially prevent shorts or shunts being formed in the solar cell.

2. The method of claim 1 wherein the anodic etching involves an electrolyte solution contacting a cathode.

3. The method of claim 2 wherein the electrolyte solution further contacts a reference electrode.

4. The method of claim 3 wherein the conductive metal layer is aluminum, the reference electrode is a dynamic hydrogen electrode and the metal layer has a potential, relative to the dynamic hydrogen electrode, from about 1.0 to about 3.0 volts.

5. The method of claim 4 wherein the potential is from about 1.5 to about 2.0 volts.

6. The method of claim 1 wherein the conductive metal layer is chosen from the group consisting of aluminum, nickel, silver, tin and stainless steel.

7. The method of claim 2 wherein the electrolyte solution is an alkaline solution.

8. The method of claim 2 wherein the electrolyte solution consists of volatile components.

9. The method of claim 2 wherein the electrolyte solution is an aqueous solution.

10. The method of claim 7 wherein the electrolyte solution includes ammonium hydroxide.

11. A method for forming a silicon device having a metal conductive layer on an insulating substrate, a second conductive layer, and at least one interposed amorphous silicon layer, the device substantially free of shorts or shunts between the metal conductive layer and the second conductive layer, the method comprising:
    providing a conductive metal layer;
    depositing a silicon layer upon the conductive metal layer so as to generally cover the conductive metal layer;
    anodic etching of any remaining uncovered conductive metal layer; and
    depositing the second conductive layer.

12. The method of claim 11 further comprising:
    precoating the silicon layer with a thin precoat layer of a transparent conductive oxide, effective to prevent oxidation of silicon.

13. The method of claim 12, wherein the precoat layer comprises:
    ZnO (optionally doped with Al, In, Ga, or B); $SnO_2$ (doped with F or Sb); $CdSnO_4$; $TiO_2$ (doped with F), or $SrTiO_2$.

14. A method for preparing an amorphous silicon n-i-p solar cell which incorporates a conductive metal layer interposed between an insulating substrate layer and the n layer of the solar cell and a transparent conductive layer overlying the p layer of the solar cell, the method comprising:
    anodically etching any exposed portions of the metal layer, after deposition of the amorphous silicon and prior to application of the transparent conductive layer, to substantially prevent shorts or shunts being formed in the solar cell.

15. The method of claim 14 wherein the anodic etching involves an electrolyte solution contacting a cathode.

16. The method of claim 15 wherein the electrolyte solution further contacts a reference electrode.

17. The method of claim 16 wherein the conductive metal layer is aluminum, the reference electrode is a dynamic hydrogen electrode and the metal layer has a potential, relative to the dynamic hydrogen electrode, from about 1.0 to about 3.0 volts.

18. The method of claim 17 wherein the potential is from about 1.5 to about 2.0 volts.

19. The method of claim 14 wherein the conductive metal layer is chosen from the group consisting of aluminum, nickel, silver, tin and stainless steel.

20. The method of claim 15 wherein the electrolyte solution includes amonium hydroxide.

* * * * *